United States Patent
Niinomi et al.

[11] Patent Number: 6,090,518
[45] Date of Patent: Jul. 18, 2000

[54] RADIATION SENSITIVE COMPOSITION

[75] Inventors: Takaaki Niinomi; Jun Fujita; Toshiyuki Urano; Etsuko Hino; Toshiaki Yokoo, all of Yokohama, Japan

[73] Assignee: Mitsubishi Chemical Corporation, Tokyo, Japan

[21] Appl. No.: 09/072,970

[22] Filed: May 6, 1998

[30] Foreign Application Priority Data

May 7, 1997 [JP] Japan ..................................... 9-116891
Jan. 13, 1998 [JP] Japan ................................... 10-018124

[51] Int. Cl.[7] ...................................................... G03F 7/004
[52] U.S. Cl. ........................ 430/170; 430/270.1; 430/905
[58] Field of Search ................................ 430/170, 270.1, 430/905

[56] References Cited

U.S. PATENT DOCUMENTS

| | | | |
|---|---|---|---|
| 5,389,491 | 2/1995 | Tani et al. | 430/170 |
| 5,424,166 | 6/1995 | Pawlowski et al. | 430/157 |
| 5,468,589 | 11/1995 | Urano et al. | 430/170 |
| 5,558,976 | 9/1996 | Urano et al. | 430/170 |
| 5,770,343 | 6/1998 | Sato et al. | 430/170 |

*Primary Examiner*—John S. Chu
*Attorney, Agent, or Firm*—Oblon, Spivak, McClelland, Maier & Neustadt, P.C.

[57] ABSTRACT

A radiation sensitive composition comprising a film-forming resin and a bis(sulfonyl)diazomethane compound of the following formula (1) or (2):

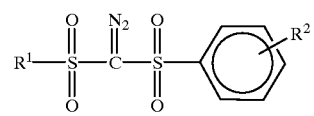

(1)

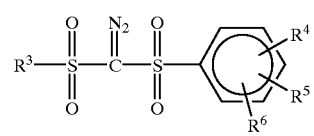

(2)

wherein each of $R^1$ and $R^3$ is a linear, branched or cyclic alkyl group which may be substituted, $R^2$ is a halogen atom, an alkoxy group which may be substituted, a nitro group, a cyano group, a nitrile group or an amide group, and each of $R^4$, $R^5$ and $R^6$ which are independent of one another, is a linear, branched or cyclic alkyl group which may be substituted, a halogen atom, an alkoxy group which may be substituted, a nitro group, a cyano group, a nitrile group or an amide group.

14 Claims, 2 Drawing Sheets

P 031-12   EXAMPLE 1

P 038   COMPARATIVE EXAMPLE 1

P 001   COMPARATIVE EXAMPLE 2

P 042   COMPARATIVE EXAMPLE 3

RADIATION SENSITIVE COMPOSITION

BACKGROUND OF THE INVENTION

1. Field of the Invention

The present invention generally relates to a radiation sensitive composition which is sensitive to radiations. Particularly, it relates to a radiation sensitive composition which is suitable as a resist for the preparation of semiconductor integrated circuits.

2. Discussion of Background

High integration of semiconductor integrated circuits progresses at a speed of four times in three years. For example, in the case of dynamic random access memory (DRAM), production of DRAM having a memory capacity as large as 16M bits has now started on a commercial basis. Accordingly, the requirements for the photolithography technology essential to the production of such integrated circuits have been stricter year after year. For example, for the production of 16M bits DRAM, a lithography technique of 0.5 μm level is required, and for more highly integrated 64M bits DRAM, a lithography technique of 0.35 μm level is required. It is accordingly desired to develop resists which can meet the requirements of the respective lithography levels.

Along with the progress in submicron processing, the wavelength used for exposure of a resist has become progressively short from i-line (365 nm) of a mercury lamp to KrF excimer laser beam (248 nm), and as a positive resist suitable for such short wave exposure, various chemical amplification type positive photoresists have been proposed. Chemical amplification type resists are resists, of which the solubility against a developer of the radiation-irradiated portion is controlled by the catalytic activity of an acid generated by irradiation with a radiation (such as ultraviolet rays, far ultraviolet rays, X-rays or charged particle beams such as electron beams), and it comprises an acid-generating agent and a compound, of which the solubility against an alkali developer increases by an acid catalytic reaction. As a problem specific to such a chemical amplification type positive photoresist, there is a problem in stability due to a delay from exposure to post exposure bake i.e. a problem of a change in the pattern dimension attributable to diffusion of an acid generated if time lapses between the exposure and the post exposure bake. As a technique to solve this problem, JP-A-5-249682 discloses a resist material containing a certain specific resin component, and a specific compound as a suitable acid-generating agent. Specifically, it discloses a resist which contains a polyhydroxystyrene having ethoxyethyl groups and bis(cyclohexylsulfonyl)diazomethane. Further, JP-A-3-223863, JP-A-4-210960, JP-A-4-211258 and U.S. Pat. No. 5,338,641, disclose similar diazomethane type compounds as acid-generating agents.

On the other hand, in the process for preparing semiconductor integrated circuits, it has heretofore been required that resists have good heat resistance. As a result of study, it has been found that such conventional resist materials are inadequate in the heat resistance. If the heat resistance is poor, deformation of a pattern occurs during to the etching process, whereby it tends to be difficult to process lines or the like formed on a substrate precisely to have desired dimensions. In order to prepare highly integrated semiconductor integrated circuits, researches have been conducted to develop a high performance radiation sensitive composition. However, it has been difficult to satisfy various properties such as sensitivity, heat resistance, pattern shape, uniformity of the coating film, and high resolution required from the process side, in good balance.

SUMMARY OF THE INVENTION

It is an object of the present invention to solve the above mentioned problems of the prior art and to provide a radiation sensitive composition having high resolution, which is useful for a halfmicronlithography employing a radiation.

Another object of the present invention is to provide a radiation sensitive composition excellent in the sensitivity and heat resistance, as a chemical amplification type resist.

As a result of further study, the present inventors have found it possible to overcome the problem by a radiation sensitive composition characterized by containing a specific sulfonyldiazomethane compound as a compound (hereinafter referred to as an acid-generating agent) which generates an acid by radiation, as a constituting component of the radiation sensitive composition. That is, the present invention provides a radiation sensitive composition comprising a film-forming resin and a bis(sulfonyl) diazomethane compound of the following formula (1) or (2):

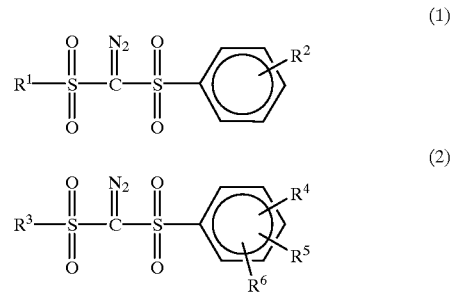

wherein each of $R^1$ and $R^3$ is a linear, branched or cyclic alkyl group which may be substituted, $R^2$ is a halogen atom, an alkoxy group which may be substituted, a nitro group, a cyano group, a nitrile group or an amide group, and each of $R^4$, $R^5$ and $R^6$ which are independent of one another, is a linear, branched or cyclic alkyl group which may be substituted, a halogen atom, an alkoxy group which may be substituted, a nitro group, a cyano group, a nitrile group or an amide group.

DETAILED DESCRIPTION OF THE PREFERRED EMBODIMENTS

Figure 1:
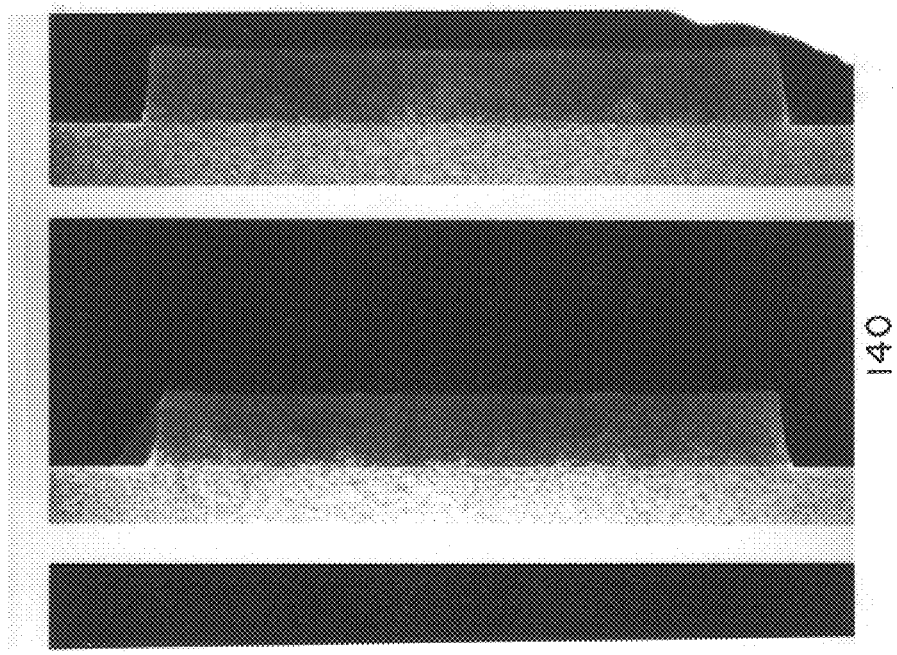
FIG. 1 is a scanning electron microscopic photograph (18,000 magnifications) of the cross-section of a line pattern in the heat resistance evaluation (140° C.) in Example 1 (photographed obliquely from front).

Now, the present invention will be described in detail with reference to the preferred embodiments.

The radiation sensitive composition of the present invention is a composition comprising a film-forming resin (hereinafter referred to as a base resin) for forming a coating film and a compound of the above formula (1) or (2) as an acid-generating agent.

The base resin to be used in the present invention is usually an alkali-soluble resin, and any resin may be employed so long as it is capable of forming a uniform coating film and, at the time of development, the exposed area becomes alkali-soluble and dissolves in an alkali developer. Preferably, it is an alkali-soluble resin or such a resin wherein at least some of alkali soluble functional groups have acid-labile protective groups. The alkali-soluble resin may, for example, be preferably a novolak resin, a polyacrylate, a polyvinylalcohol, a polyhydroxystyrene or derivatives thereof. Particularly preferred among them is a novolak resin, a polyhydroxystyrene or derivatives thereof (hereinafter referred to as polyhydroxystyrenes). The polyhydroxystyrenes are resins obtained by homopolymerization of hydroxystyrene or copolymerization of hydroxystyrene with various vinyl monomers. The vinyl monomers copolymerizable with hydroxystyrene may, for example, be acrylic acid, vinyl alcohol or derivatives thereof. The hydroxystyrene may have a substituent such as an alkyl group on the benzene ring.

The novolak resin may be prepared by polycondensation of hydroxy aromatic compound with an aliphatic aldehyde such as formaldehyde, paraformaldehyde or acetoaldehyde, an aromatic aldehyde such as benzaldehyde or hydroxybenzaldehyde, or a carbonyl compound such as an alkyl ketone such as an alkyl ketone such as acetone with heating in the presence of an acid catalyst such as hydrochloric acid, sulfuric acid or oxalic acid. The above hydroxy aromatic compound is such as a phenol which may be substituted by an alkyl group or an aryl group, such as phenol, o-cresol, m-cresol, p-cresol, 3-ethylphenol, 2,5-xylenol, 3,5-xylenol or phenylphenol; an alkoxy or aryloxy phenol such as 2-methoxyphenol, 4-methoxyphenol or 4-phenoxyphenol; a naphthol which may be substituted by an alkyl group, such as α-naphthol, β-naphthol or 3-methyl-α-naphthol; a polyhyroxybenzene which may be substituted by an alkyl group, such as 1,3-dihydroxybenzene, 1,3-dihydroxy-2-methylbenzene, 1,2,3-trihydroxybenzene, 1,2,3-trihydroxy-5-methylbenzene or 1,3,5-trihydroxybenzene.

The above hydroxy aromatic compound may have a substituent such as a halogen atom, a nitro group or an ester group, so long as such a substituent does not adversely affect the present invention. Such a resin may further be reduced by e.g. hydrogen to lower the light absorbance in a short wavelength region, as the case requires.

The polyhydroxystyrenes may more specifically be resins obtained by polymerizing hydroxystyrenes such as o-hydroxystyrene, m-hydroxystyrene, p-hydroxystyrene, 2-(o-hydroxyphenyl)propylene, 2-(m-hydroxyphenyl)propylene, and 2-(p-hydroxyphenyl)propylene, alone or in combination of two or more of them, in the presence of a radical polymerization initiator, an anion polymerization initiator or a cation polymerization initiator. Further, after the polymerization, hydrogenation may be carried out to lower the absorbance of the resin. Further, the aromatic compound monomer may have a substituent such as a halogen atom, a nitro group or an ester group, so long as such a substituent does not adversely affect the present invention. The weight-average molecular weight of the alkali-soluble resin is usually from 1,000 to 100,000, preferably from 7,000 to 60,000, more preferably from 9,000 to 60,000, as calculated as polystyrene (as measured by gel permeation chromatography).

If the molecular weight of the alkali-soluble resin is smaller than this range, no adequate coating film as a resist can be obtained, and the heat resistance tends to be poor. If it exceeds this range, the solubility of the exposed area in the alkali developer tends to be small, and a resist pattern tends to be hardly obtainable.

Among base resins, preferred is a resin in which some of alkali soluble functional groups, particularly some of hydroxyl groups, of the alkali-soluble resin are protected by acid-labile protective groups (protective groups removable by an acid catalyst). Such protective groups are not particularly limited so long as they are protective groups removable by an acid. Specifically, those having structures of the following formulae (3), (4) and (5) may be mentioned, and these protective groups may be used alone or in combination.

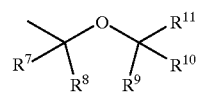

(3)

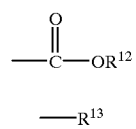

(4)

(5)

wherein each of $R^7$ to $R^{11}$ which are independent of one another, is a hydrogen atom, an alkyl group or an alkoxy group, provided that $R^7$ and $R^9$ may bond to form a ring, and each of $R^{12}$ and $R^{13}$ is an alkyl group.

The carbon number of the alkyl group or the alkoxy group represented by $R^7$ to $R^{11}$ is preferably from 1 to 6, more preferably from 1 to 4, and the carbon number of the alkyl group represented by $R^{12}$ and $R^{13}$ is preferably from 1 to 10. When $R^7$ and $R^9$ bond to form a ring, —$R^7$—$R^9$— may, for example, be an alkylene chain, preferably —$CH_2CH_2$— or —$CH_2CH_{CH2}$—.

Specific examples of the group of the formula (3) include an exthoxyethyl group, an ethoxypropyl group, a propoxyethyl group, a n-butoxyethyl group, an iso-butoxyethyl group, a t-butoxyethyl group, a tetrahydrofuranyl group and a tetrahydropyranyl group. However, it is not limited to such specific examples. Particularly preferred is an ethoxyethyl group from the viewpoint of the resolution.

Specific examples of the group of the formula (4) include an ethoxycarbonyl group, a propoxycarbonyl group and a t-butoxycarbonyl group. However, it is not limited to such specific examples. Particularly preferred is a t-butoxycarbonyl group.

Specific examples of the group of the formula (5) include a methyl group, an ethyl group, a n-propyl group, an iso-propyl group, a t-butyl group, a cyclohexyl group, a norbornyl group and an adamantyl group. However, it is not limited to such specific examples. Particularly preferred is a t-butyl group.

The above described base resins may be used alone or in combination as a mixture of two or more them.

The ratio of the acid-labile protective groups introduced, is usually from 10 to 60%, preferably from 20 to 50%, more preferably from 20 to 40%, from the viewpoint of the heat resistance and image-forming ability.

Among the above resins, a resin wherein some of hydroxyl groups of polyhydroxystyrenes are protected by acid-labile protective groups, is advantageous from the viewpoint of the contrast in the solubility as between before and after exposure and the transparency of the resin, especially when excimer laser is used as a light source. As the protective groups, those of the formula (3) are preferred. More preferred are a t-butyloxycarbonyl group, a tetrahydropyranyl group and an ethoxyethyl group. Particularly preferred is an ethoxyethyl group.

The present invention is an invention characterized by containing a compound of the above formula (1) or (2) as an acid-generating agent.

The linear, branched or cyclic alkyl group which may be substituted, represented by $R^1$, $R^3$, $R^4$, $R^5$ and $R^6$ in the formula (1) or (2), may preferably be a $C_{1-6}$ linear or branched alkyl group, or a $C_{3-10}$ cyclic alkyl group, and the substituent may, for example, be a halogen atom, or a $C_{1-4}$ alkoxy group. Each of $R^1$ and $R^3$ is preferably a cyclic alkyl group which may be substituted, more preferably an unsubstituted $C_5$, or $C_6$ cyclic alkyl group. The halogen atom represented by $R^2$, $R^4$, $R^5$ or $R^6$ may be a fluorine atom, a chlorine atom or a bromine atom, and the alkoxy group which may be substituted, may be a $C_{1-4}$ alkoxy group which may be substituted by a substituent such as a halogen atom, or the like such as trifluoromethoxy, trichloromethoxy, tribromomethoxy or pentafluoroethoxy. Substituent $R^2$ is preferably a halogen atom or a $C_{1-4}$ alkoxy group which may be substituted, more preferably a halogen atom or a $C_{1-4}$ alkoxy group. Further, the substituted position of $R^2$ is not particularly limited but an ortho- or para- position is preferred, and particularly preferred is a para-position from the balance of all of the heat resistance, the sensitivity and the resolution.

Specific examples of the compound of the above formula (1) include cyclohexylsulfonyl-(2-methoxyphenylsulfonyl)diazomethane, cyclohexylsulfonyl-(3-methoxyphenylsulfonyl)diazomethane, cyclohexylsulfonyl-(4-methoxyphenylsulfonyl)diazomethane, cyclopentylsulfonyl-(2-methoxyphenylsulfonyl)diazomethane, cyclopentylsulfonyl-(3-methoxyphenylsulfonyl)diazomethane, cyclopentylsulfonyl-(4-methoxyphenylsulfonyl)diazomethane, cyclohexylsulfonyl-(2-fluorophenylsulfonyl)diazomethane, cyclopentylsulfonyl-(2-fluorophenylsulfonyl)diazomethane, cyclohexylsulfonyl-(4-fluorophenylsulfonyl)diazomethane, cyclopentylsulfonyl-(4-fluorophenylsulfonyl)diazomethane, cyclohexylsulfonyl-(4-chlorophenylsulfonyl)diazomethane, cyclopentylsulfonyl-(4-chlorophenylsulfonyl)diazomethane, cyclohexylsulfonyl-(3-trifluoromethylphenylsulfonyl) diazomethane, cyclopentylsulfonyl-(3-trifluoromethylphenylsulfonyl)diazomethane, cyclohexylsulfonyl-4-trifluoromethoxyphenylsulfonyldiazomethane, and cyclopentylsulfonyl-4-trifluoromethoxyphenylsulfonyldiazomethane. Specific examples of the compound of the above formula (2) include cyclohexylsulfonyl-(2,4,6-trimethylphenylsulfonyl)diazomethane, cyclohexylsulfonyl-(2,3,4-trimethylphenylsulfonyl)diazomethane, cyclohexylsulfonyl-(2,4,6-triethylphenylsulfonyl)diazomethane, cyclohexylsulfonyl-(2,3,4-triethylphenylsulfonyl)diazomethane, cyclopentylsulfonyl-(2,4,6-trimethylsulfonyl)diazomethane and cyclopentylsulfonyl-(2,3,4-trimethylphenylsulfonyl)diazomethane. Among them, an acid-generating agent of the formula (1) is preferred. Particularly preferred is a cyclohexylsulfonyl-(2,4,6-trimethylphenylsulfonyl)diazomethane, cyclohexylsulfonyl-(4-methoxyphenylsulfonyl)diazomethane, or cyclohexylsulfonyl-(4-fluorophenylsulfonyl)diazomethane.

The total amount of the acid-generating agent of the formula (1) or (2) is usually from 0.05 to 20 parts by weight, more preferably from 0.1 to 10 parts by weight, per 100 parts by weight of the base resin. If the amount of the acid-generating agent is smaller than this range, the sensitivity tends to be poor, and if the acid-generating agent exceeds this range, the resist film tends to be deteriorated by this acid-generating agent, whereby the resist pattern tends to be poor, thus leading to deterioration of the resolution.

In the present invention, one or more other acid-generating agents may be incorporated within a range not to impair the effects of the present invention.

As suitable acid-generating agents to be incorporated, any agents may be employed so long as they are capable of generating acids by lights or electron beams used for exposure. Specifically, they may, for example, be a halogen-containing s-triazine derivative such as tris (trichloromethyl)-s-triazine, tris(tribromomethyl)-s-triazine or 2,4-bis(tribromomethyl)-6-p-methoxyphenyl-s-triazine, a halogenated paraffin type hydrocarbon such as 1,2,3,4-tetrabromobutane, 1,1,2,2-tetrabromoethane, carbon tetrabromide or iodoform, a halogenated cycloparaffin type hydrocarbon such as hexabromocyclohexane, hexachlorocyclohexane or hexabromocyclododecane, a halogen-containing benzene derivative such as bis(trichloromethyl)benzene or bis(tribromomethyl)benzene, a halogen-containing sulfone compound such as tribromomethylphenylsulfone, tricycloromethylphenylsulfone or 2,3-dibromosulforane, a halogen-containing isocyanurate derivative such as tris(2,3-dibromopropyl) isocyanurate, a sulfonium salt such as triphenylsulfonium chloride, triphenylsulfonium methanesulfonate, triphenylsulfonium trifluoromethanesulfonate, triphenylsulfonium p-toluenesulfonate, triphenylsulfonium tetrafluoroborate, triphenylsulfonium hexafluoroarsenate or triphenylsulfoniumhexafluorophosphonate, an iodonium salt such as diphenyliodonium trifluoromethanesulfonate, diphenyliodonium p-toluenesulfonate, diphenyliodonium tetrafluoroborate, diphenyliodonium hexafluoroarsenate or diphenyliodonium hexafluorophosphonate, a sulfonic acid ester such as methyl p-toluenesulfonate, ethyl p-toluenesulfonate, butyl p-toluenesulfonate, phenyl p-toluenesulfonate, 1,2,3-tri(p-toluenesulfonyl)benzene, benzoin p-toluenesulfonate, methyl methanesulfonate, ethyl methanesulfonate, butyl methanesulfonate, 1,2,3-tri (methanesulfonyl)benzene, phenyl methanesulfonate, benzoin methanesulfonate, methyl trifluoromethanesulfonate, ethyl trifluoromethanesulfonate, butyl trifluoromethanesulfonate, 1,2,3-tri (trifluoromethanesulfonyl)benzene, phenyl trifluoromethanesulfonate or benzoin trifluoromethanesulfonate, a disulfone such as diphenyldisulfone, a sulfonediazide such as bis(phenylsulfonyl)diazomethane or bis (cyclohexylsulfonyl)diazomethane, an o-nitrobenzylester such as o-nitrobenzyl-p-toluenesulfonate and a sulfonehydrazide such as an N,N'-di(phenylsulfonyl)hydrazide. The compound containing an orthoquinonediazide group may usually be an orthoquinonediazide type compound of an ester or amide of e.g. 1,2-benzoquinonediazide-4-sulfonic acid, 1,2-naphthoquinonediazide-4-sulfonic acid or 1,2-naphthoquinonediazide-5-sulfonic acid.

To the radiation sensitive composition of the present invention, additives may be incorporated to an extent not to impair the effects of the present invention. The additives may, for example, be a dissolution inhibitor, a surfactant, a sensitizer, and a nitrogen-containing compound.

The dissolution inhibitor is a compound which controls the solubility of a non-exposed area of the alkali soluble resin in the alkali developer, and it may be a low molecular compound or a high molecular resin so long as it is one having groups removable by the action of an acid catalyst. Preferably, it is a compound having hydrogen atoms of acidic functional groups such as phenolic hydroxyl groups or carboxyl groups protected by groups removable by the effect of an acid catalyst. The low molecular compound may, for example, be a compound of the following formula (6) or (7) which may be represented by a phenolic compound such as a bisphenol derivative or a trisphenol derivative:

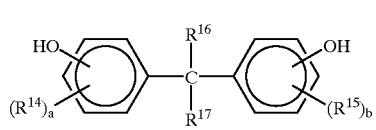

(6)

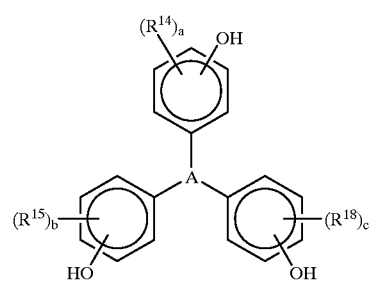

(7)

wherein each of $R^{14}$, $R^{15}$, $R^{16}$, $R^{17}$ and $R^{18}$ which are independent of one another, is a halogen atom, an alkyl group, an alkoxy group or an aralkyl group, each of a, b and c which are independent of one another, is an integer within a range of from 0 to 4, provided that $R^{16}$ and $R^{17}$ may form an alkylene ring containing them, and A is

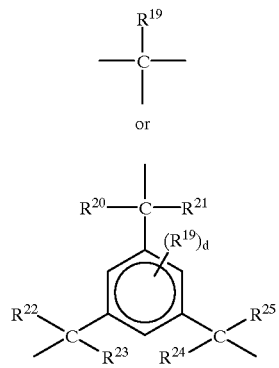

wherein each of $R^{19}$ to $R^{25}$ which are independent of one another, is a hydrogen atom or an alkyl group, and d is an integer within a range of from 0 to 3.

The structures of the groups removable by the action of an acid catalyst are represented by the above protective groups of the formula (3), (4) or (5). Particularly preferred is, for example, a t-butyloxycarbonyl group, a tetrahydropyranyl group or an ethoxyethyl group. Further, the dissolution inhibitors to be used in the present invention may be used alone or in combination as a mixture of two or more of them.

When the dissolution inhibitor is incorporated, it is incorporated usually in a proportion of from 1 to 50 parts by weight, preferably from 5 to 30 parts by weight, per 100 parts by weight of the film-forming resin.

The nitrogen-containing compound is a compound which functions as a base against an acid formed from the acid-generating agent, and it is effective to prevent a dimensional change of a resist pattern due to diffusion of the acid formed from the acid-generating agent during the period from the exposure to the post exposure bake. Accordingly, it is not particularly limited so long as it is a compound capable of neutralizing the acid formed from the acid-generating agent, but an organic amine compound may be mentioned. Specifically, it may, for example, be a pyrimidine compound such as pyrimidine, 2-aminopyrimidine, 4-aminopyrimidine, 5-aminopyrimidine, 2,4-diaminopyrimidine, 2,5-diaminopyrimidine, 4,5-diaminopyrimidine, 4,6-diaminopyrimidine, 2,4,5-triaminopyrimidine, 2,4,6-triaminopyrimidine, 4,5,6-triaminopyrimidine, 2,4,5,6-tetraaminopyrimidine, 2-hydroxypyrimidine, 4-hydroxypyrimidine, 5-hydroxypyrimidine, 2,4-dihydroxypyrimidine, 2,5-dihydroxypyrimidine, 4,5-dihydroxypyrimidine, 4,6-dihydroxypyrimidine, 2,4,5-trihydroxypyrimidine, 2,4,6-trihydroxypyrimidine, 4,5,6-trihydroxypyrimidine, 2,4,5,6-tetrahydroxypyrimidine, 2-amino-4-hydroxypyrimidine, 2-amino-5-hydroxypyrimidine, 2-amino-4,5-dihydroxypyrimidine, 2-amino-4,6-dihydroxypyrimidine, 4-amino-2,5-dihydroxypyrimidine, 4-amino-2,6-dihydroxypyrimidine, 2-amino-4-methylpyrimidine, 2-amino-5-methylpyrimidine, 2-amino-4,5-dimethylpyrimidine, 2-amino-4,6-dimethylpyrimidine, 4-amino-2,5-dimethylpyrimidine, 4-amino-2,6-dimethylpyrimidine, 2-amino-4-methoxypyrimidine, 2-amino-5-methoxypyrimidine, 2-amino-4,5-dimethoxypyrimidine, 2-amino-4,6-dimethoxypyrimidine, 4-amino-2,5-dimethoxypyrimidine, 4-amino-2,6-dimethoxypyrimidine, 2-hydroxy-4-methylpyrimidine, 2-hydroxy-5-methylpyrimidine, 2-hydroxy- 4,5-dimethylpyrimidine, 2-hydroxy-4,6-dimethylpyrimidine, 4-hydroxy-2,5-dimethylpyrimidine, 4-hydroxy-2,6-dimethylpyrimidine, 2-hydroxy-4-methoxypyrimidine, 2-hydroxy-5-methoxypyrimidine, 2-hydroxy-4,5-dimethoxypyrimidine, 2-hydroxy-4,6-dimethoxypyrimidine, 4-hydroxy-2,5-dimethoxypyrimidine or 4-hydroxy-2,6-dimethoxypyrimidine, an amine substituted by a $C_{1-4}$ hydroxyalkyl group, such as diethanolamine, triethanolamine, triisopropanolamine, tris(hydroxymethyl) aminomethane or bis(2-hydroxyethyl)iminotris (hydroxymethyl)methane or an aminophenol such as 2-aminophenol, 3-aminophenol or 4-aminophenol. Preferred is an amine having a hydroxyl group. The content of the nitrogen-containing compound is usually from 0.1 to 100 mol %, more preferably from 1 to 50 mol %, relative to the content of the acid-generating agent.

In the present invention, the radiation sensitive composition is used as dissolved in a suitable solvent which is capable of dissolving the above mentioned various components including the base resin and the acid-generating agent. A preferred solvent may, for example, be a cellosolve solvent such as methylcellosolve, ethylcellosolve, methylcellosolve acetate or ethylcellosolve acetate, an ester solvent such as diethyl oxalate, ethyl pyruvate, ethyl-2-hydroxy butyrate, ethyl acetoacetate, butyl acetate, amyl acetate, ethyl butyrate, butyl butyrate, methyl lactate, ethyl lactate, methyl 3-methoxypropionate or methyl 2-hydroxy-2-methylpropionate, a propylene glycol solvent such as propylene glycol monomethyl ether, propylene glycol monoethyl ether, propylene glycol monobutyl ether, propylene glycol monomethyl ether acetate, propylene glycol monoethyl ether acetate, propylene glycol monobutyl ether acetate or dipropylene glycol dimethyl ether, a ketone solvent such as 2-hexanone, cyclohexanone, methylamylketone or 2-heptanone, or a mixed solvent thereof, or one having an aromatic hydrocarbon added thereto.

The solvent is used preferably in an amount within a range of from 1 to 20 times by weight, relative to the total amount of the solid content of the radiation sensitive composition.

When a resist pattern is to be formed on a semiconductor substrate by means of the radiation sensitive composition of the present invention to be used as a photoresist, the radiation sensitive composition of the present invention is dissolved in the above mentioned solvent, may usually be coated on the semiconductor substrate, followed by steps of prebake, transfer of a pattern by exposure, post exposure bake and development. The semiconductor substrate is usually one commonly used as a substrate for the production of semiconductors, and it may, for example, be a silicon substrate or a gallium arsenic substrate.

For coating the radiation sensitive composition, a spin coater is usually employed, and for the exposure, a light of 254 nm of a low pressure mercury lamp, a light of 157 nm, 193 nm, 222 nm or 248 rim from a light source of e.g. excimer laser, or an electron beam may, for example, be suitably employed. It is particularly advantageous to use excimer laser as the light source. The light used for exposure may not necessarily be a monochromatic light and may be broad. Further, exposure by a phase shift method may also be used.

As a developer for the radiation sensitive composition of the present invention, an inorganic alkali such as sodium hydroxide, potassium hydroxide, sodium carbonate, sodium silicate, sodium methasilicate or aqueous ammonia, a primary amine such as ethylamine or n-propylamine, a secondary amine such as diethylamine or di-n-propylamine, a tertiary amine such as triethylamine or N,N-diethylmethylamine, or a quarternary ammonium salt such as tetramethylammoniumhydroxide or trimethylhydroxyethylammoniumhydroxide, or one having an alcohol, a surfactant, etc., added thereto, may be employed.

The radiation sensitive composition of the present invention is useful not only for the production of ULSI but also for the production of general IC, for the production of masks, for forming images, for the production of liquid crystal image screens, for the production of color filters, or for offset printing. It is particularly useful manufacturing of semiconductor integrated circuits.

Now, the present invention will be described in further detail with reference to Examples. But it should be understood that the present invention is by no means restricted to such specific Examples.

Reference Example 1
Synthesis of 1-ethoxyethylated Polyvinylphenol

Into a 1 L four necked flask equipped with a nitrogen supply tube, a stirrer and a thermometer, 100 g of polyvinylphenol (weight-average molecular weight: 17,200) and 500 mL of tetrahydrofuran were mixed and dissolved, and then 36.0 g of ethyl vinyl ether was added thereto, followed by stirring to obtain a solution. 0.5 g of 35% hydrochloric acid was added thereto, and the mixture was heated to 40° C. by a water bath, and stirring was continued for two hours. Then, to this reaction solution, 5 mL of 28% aqueous ammonia was added, and the mixture was stirred for 30 minutes. This reaction solution was dropped into 9 L of pure water, whereupon the obtained precipitate was collected by filtration. Further, this precipitate was dissolved in acetone, and the solution was dropped into pure water for reprecipitation, whereupon the desired resin was recovered. The recovered resin was vacuum-dried to obtain 100 g of 1-ethoxyethylated polyvinylphenol. The obtained resin was dissolved in deuterated acetone, and the proton NMR spectrum was measured, whereupon the acetal ratio was determined from the area ratio of a signal of an aromatic hydrogen at a δ value of from 6.2 to 7.0 to a signal of acetal methinehydrogen at a δ value of from 5.2 to 5.5 and was found to be 35.0%.

Reference Example 2
Synthesis of p-toluenesulfonyl Azide 71.5 g of sodium azide was dissolved in 200 mL of water and mixed with 400 mL of 90% ethanol in a 2 L Erlenmeyer flask. To this solution, 1 L of a 99% ethanol solution containing 190.5 g of tosyl chloride heated to 45° C., was added with stirring, and stirring was continued at room temperature for 2.5 hours. From the reaction mixture, ethanol was evaporated under reduced pressure, and to the residue, 1.2 L of water was added, whereupon an oily azide was separated by means of a separatory funnel, washed with water, dried by anhydrous sodium sulfate and subjected to aspiration filtration to obtain 160 g of colorless p-toluenesulfonyl azide.

Preparation Example 1
Synthesis of Cyclohexylsulfonyl-(4-methoxyphenylsulfonyl)Diazomethane (1) Into a 1 L four necked flask equipped with a nitrogen supply tube, a stirrer and a thermometer, 12.1 g of paraformaldehyde and 60 g of toluene were mixed and stirred, and then 120 mL of concentrated hydrochloric acid was added thereto. Thereafter, the reaction solution was heated to 40° C., and 60 g of a toluene solution containing 35.4 g of cyclohexanethiol was added over a period of 20 minutes. After completion of the dropwise addition, the reaction solution was stirred while maintaining it at 50° C. After confirming the completion of the reaction by TLC, the water phase was discharged, and the organic phase was made alkaline with a saturated sodium carbonate aqueous solution to obtain a toluene solution of chloromethylcyclohexylsulfide.

(2) 7.4 g of 4-methoxybenzenethiol was put into a 200 mL flask, and 45.2 g of a 5 wt % ethanol solution of sodium hydroxide was added thereto, followed by stirring. While cooling this flask with water, 27.8 g of the toluene solution of chloromethylcyclohexylsulfide obtained in (1) was dropwise added in 5 minutes. After stirring for two hours, the temperature was raised to 70° C., and stirring was further continued for one hour. To this reaction solution, 500 mg of sodium tungstate was added, then 25 g of a 30% hydrogen peroxide aqueous solution was added over one hour, followed by stirring for 5 hours. The reaction solution was extracted with toluene, and the extract was dried over anhydrous sodium sulfate, whereupon the solvent was evaporated under reduced pressure to obtain cyclohexylsulfonyl(4-methoxyphenylsulfonyl) methane.

(3) 3.0 g of the cyclohexylsulfonyl-(4-methoxyphenylsulfonyl)methane prepared in (2), was put into a flask, and 100 mL of ethanol was added thereto, followed by stirring. Further, to this solution, 8.0 g of a 5 wt % ethanol solution of sodium hydroxide was added, followed by stirring. This reaction solution was cooled to from −5° C. to −10° C., and 35 mL of pure water was added thereto. Then, 10 mL of the ethanol solution containing 2.0 g of p-toluenesulfonylazide obtained in Reference Example 2, was dropwise added thereto over a period of 5 minutes, and the mixture was stirred for 3 hours and left to stand overnight. Then, the precipitate was collected by filtration to obtain crude crystals. The crude crystals were re-crystallized from ethanol to obtain cyclohexylsulfonyl-(4-methoxyphenylsulfonyl) diazomethane.

Preparation Example 2
Synthesis of Cyclohexylsulfonyl-(2-methoxyphenylsulfonyl)Diazomethane Using 2-methoxybenzenethiol instead of the thiol compound shown in (2) in Preparation Example 1, a reaction was carried out in the same manner as in Preparation Example 1 to obtain crude crystals. The crude crystals were subjected to column separation using a silica gel column C-200 (manufactured by WAKO PURE CHEMICAL INDUSTRIES, LTD.) by means of a solvent comprising ethyl acetate/n-hexane in a volume ratio of 1:4, to obtain the desired cyclohexylsulfonyl-(2-methoxyphenylsulfonyl) diazomethane.

Preparation Example 3
Synthesis of Cyclohexylsulfonyl-(4-fluorophenylsulfonyl)Diazomethane Using 4-fluorobenzenethiol instead of the thiol compound shown in (2) in Preparation Example 1, a reaction was carried out in the same manner as in Preparation Example 1 to obtain crude crystals. The crude crystals were subjected to column separation using a silica gel column C-200 (manufactured by WAKO PURE CHEMICAL INDUSTRIES, LTD.) by means of a solvent comprising ethyl acetate/n-hexane in a volume ratio of 1:4, to obtain the desired cyclohexylsulfonyl-(4-fluorophenylsulfonyl) diazomethane.

Preparation Example 4
Synthesis of Cyclohexylsulfonyl-(2,4,6-trimethylphenylsulfonyl)Diazomethane Using 2,4,6-trimethylbenzenethiol instead of the thiol compound shown in (2) in Preparation Example 1, a reaction was carried out in the same manner as in Preparation Example 1 to obtain crude crystals. The crude crystals were subjected to column separation using a silica gel column C-200 (manufactured by WAKO PURE CHEMICAL INDUSTRIES, LTD.) by means of a solvent comprising ethyl acetate/n-hexane in a volume ratio of 1:4, to obtain the desired cyclohexylsulfonyl-(2,4,6-trimethylphenylsulfonyl) diazomethane.

Prepatation Example 5
Synthesis of Cyclohexylsulfonylphenylsulfonyldiazomethane

Using benzenethiol instead of the thiol compound shown in (2) in Preparation Example 1, a reaction was carried out in the same manner as in Preparation Example 1 to obtain crude crystals. The crude crystals were subjected to column separation using a silica gel column C-200 (manufactured by WAKO PURE CHEMICAL INDUSTRIES, LTD.) by means of a solvent comprising ethyl acetate/n-hexane in a volume ratio of 1:4, to obtain the desired cyclohexylsulfonyl-phenylsulfonyldiazomethane.

EXAMPLE 1

0.8 g of the resin prepared in Reference Example 1, 0.016 g of cyclohexylsulfonyl-(4-methoxyphenylsulfonyl) diazomethane prepared in Preparation Example 1 as an acid-generating agent, and 4.48 g of propylene glycol monomethyl ether acetate, were mixed, and triisopropanolamine was further added in an amount corresponding to 1/10 mol of the acid-generating agent, to obtain a resist solution. This photosensitive liquid was spin-coated on a wafer having an anti-reflective film (DUV18, manufactured by Brewer Science Company) coated on a silicon substrate, and baked at 80° C. for 60 seconds on a hot plate to form a resist film having a thickness of 0.72 $\mu$m. This resist film on the substrate was exposured by KrF excimer laser stepper (NA=0.42) manufactured by NIKON CORPORATION, and then baked at 120° C. for 60 seconds on a hot plate. Thereafter, this resist film was developed for one minute with an aqueous solution containing 2.38 wt % of tetramethylammonium hydroxide. The resist pattern obtained by this development, was observed by a scanning electron microscope, whereby the sensitivity, i.e. the exposure (hereinafter referred to as $E_0$) at which a line and a space of 0.30 $\mu$m were resolved 1:1, and the resolution (the resolution ability at exposure $E_0$), were evaluated. On the other hand, the same operation was carried out on a silicon substrate to form a pattern. This silicon substrate was baked at 140° C. and 150° C. for 5 minutes on a hot plate. Thereafter, a cross-section of a line pattern of 5.0 $\mu$m was cut out, and observed by a scanning electron microscope to evaluate the heat resistance. The evaluation standards were as follows.

A: The corners of the pattern still remain.
B: The corners of the pattern still remain, but the pattern is substantially tapered.
C: The corners of the pattern are rounded.
D: The corners of the pattern have disappeared.

The results of the heat resistance test are shown in Table 1 together with the results of the sensitivity and the resolution.

EXAMPLE 2

A resist solution was prepared and evaluated in the same manner as in Example 1 except that 0.016 g of cyclohexylsulfonyl-(2-methoxyphenylsulfonyl) diazomethane prepared in Preparation Example 2 was used as the acid-generating agent. The results are shown in Table 1.

EXAMPLE 3

A resist solution was prepared and evaluated in the same manner as in Example 1 except that 0.016 g of cyclohexylsulfonyl-(4-fluorophenylsulfonyl)diazomethane prepared in Preparation Example 3 was used as the acid-generating agent. The results are shown in Table 1.

Comparative Example 1

A resist solution was prepared and evaluated in the same manner as in Example 1 except that 0.016 g of bis (cyclohexylsulfonyl)diazomethane (an acid-generating agent disclosed in Example 1 of JP-A-4-210910, manufactured by Midori Kagaku Co., Ltd.) was used as the acid-generating agent. The results are shown in Table 1.

Comparative Example 2

A resist solution was prepared and evaluated in the same manner as in Example 1 except that 0.016 g of bis (phenylsulfonyl)diazomethane (an acid-generating agent disclosed in Example 5 of U.S. Pat. No. 5,338,641, manufactured by Midori Kagaku Co., Ltd.) was used as the acid-generating agent. The results are shown in Table 1.

Comparative Example 3

A resist solution was prepared and evaluated in the same manner as in Example 1 except that 0.016 g of cyclohexylsulfonylphenylsulfonyldiazomethane prepared in Preparation Example 5 was used as the acid-generating agent. The results are shown in Table 1.

Comparative Example 4

A resist solution was prepared and evaluated in the same manner as in Example 1 except that 0.016 g of bis(3,4-dimethylphenylsulfonyl)diazomethane (an acid-generating agent disclosed in Example 3 in JP-A-3-223863) was used as the acid-generating agent. The results are shown in Table 1.

TABLE 1

| Examples | Structure of acid-generating agent | $E_0$ (mJ/cm$^2$) | Resolution (μm) | Heat resistance 140° C./150° C. |
|---|---|---|---|---|
| Example 1 | cyclohexyl-SO$_2$-C(N$_2$)-SO$_2$-C$_6$H$_4$-OCH$_3$ (para) | 25.6 | 0.26 | A/A |
| Example 2 | cyclohexyl-SO$_2$-C(N$_2$)-SO$_2$-C$_6$H$_4$-OCH$_3$ (ortho) | 46.2 | 0.28 | A/C |
| Example 3 | cyclohexyl-SO$_2$-C(N$_2$)-SO$_2$-C$_6$H$_4$-F (para) | 26.8 | 0.26 | A/B |
| Comparative Example 1 | cyclohexyl-SO$_2$-C(N$_2$)-SO$_2$-cyclohexyl | 60.0 | 0.28 | B/D |
| Comparative Example 2 | phenyl-SO$_2$-C(N$_2$)-SO$_2$-phenyl | 18.0 | 0.28 | C/D |
| Comparative Example 3 | cyclohexyl-SO$_2$-C(N$_2$)-SO$_2$-phenyl | 27.0 | 0.26 | D/D |
| Comparative Example 4 | (3,4-(CH$_3$)$_2$-C$_6$H$_3$)-SO$_2$-C(N$_2$)-SO$_2$-(3,4-(CH$_3$)$_2$-C$_6$H$_3$) | 16.8 | 0.26 | C/D |

Figure 2:
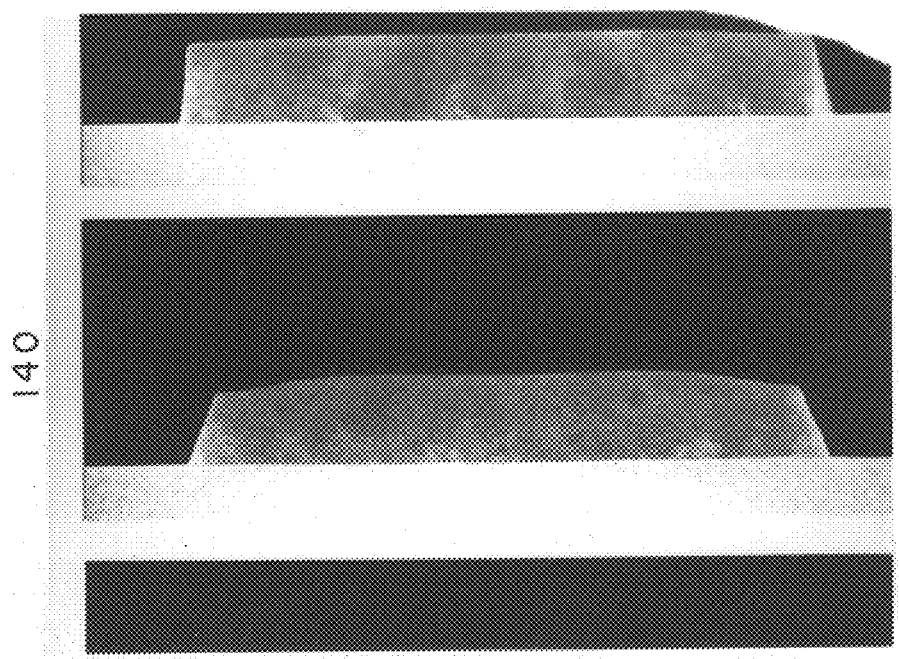
FIG. 2 is a scanning electron microscopic photograph (18,000 magnifications) of the cross-section of a line pattern in the heat resistance evaluation (140° C.) in Comparative Example 1 (photographed from the front).
Figure 3:
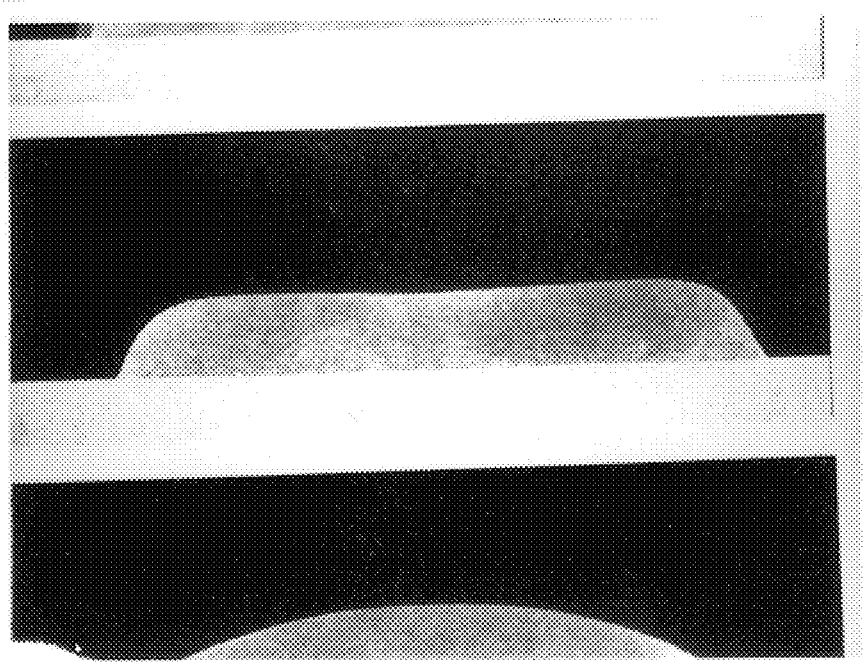
FIG. 3 is a scanning electron microscopic photograph (18,000 magnifications) of the cross-section of a line pattern in the heat resistance evaluation (140° C.) in Comparative Example 2 (photographed from the front).
Figure 4:
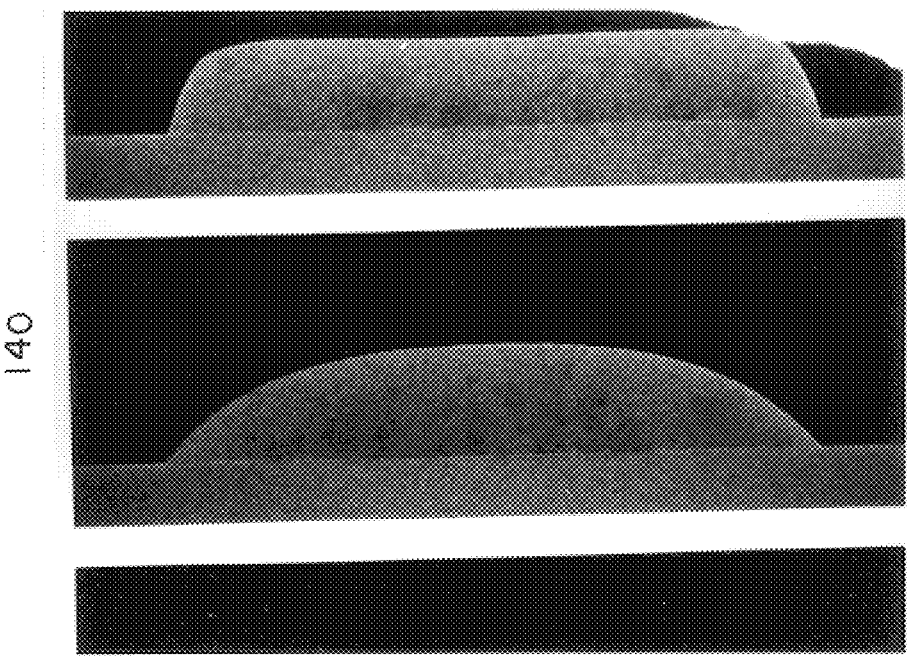
FIG. 4 is a scanning electron microscopic photograph (18,000 magnifications) of the cross-section of a line pattern in the heat resistance evaluation (140° C.) in Comparative Example 3 (photographed from the front).

As typical examples for the evaluation results (evaluation standards A to D) of the heat resistance, scanning electron microscopic photographs of cross sections of patterns after baking at 140° C. for 5 minutes in Example 1 and Comparative Examples 1 to 3, are shown in FIGS. 1 to 4.

The radiation sensitive composition of the present invention employs the specific bis(sulfonyl)diazomethane compound as its component, whereby it has a practically adequate sensitivity despite it has a resolution equal or superior to the conventional product, and yet it is excellent in the heat resistance. Thus, it is practically extremely useful.

What is claimed is:

1. A radiation sensitive composition comprising a film-forming resin and a bis(sulfonyl)diazomethane compound of the following formula (1) or (2):

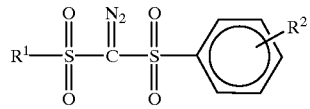
(1)

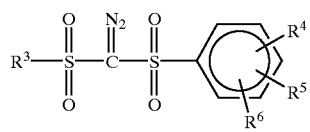
(2)

wherein each of $R^1$ and $R^3$ is a linear, branched or cyclic alkyl group which may be substituted, $R^2$ is a halogen atom, an alkoxy group which may be substituted, a nitro group, a cyano group, or an amide group, and each of $R^4$, $R^5$ and $R^6$ which are independent of one another, is a linear, branched or cyclic alkyl group which may be substituted, a halogen atom, an alkoxy group which may be substituted, a nitro group, a cyano group, or an amide group.

2. The radiation sensitive composition according to claim 1, wherein each of $R^1$ in the formula (1) and $R^3$ in the formula (2) is a cyclic alkyl group which may be substituted.

3. The radiation sensitive composition according to claim 2, wherein the bis(sulfonyl)diazomethane compound is of the formula (1), and $R^2$ is a halogen atom or a $C_{1-4}$ alkoxy group which may be substituted.

4. The radiation sensitive composition according to claim 2, wherein $R^2$ is a halogen atom or a $C_{1-4}$ alkoxy group.

5. The radiation sensitive composition according to claim 3, wherein $R^1$ is an unsubstituted $C_5$ or $C_6$ cyclic alkyl group.

6. The radiation sensitive composition according to claim 3, wherein $R^2$ is substituted at the para-position.

7. The radiation sensitive composition according to claim 2, wherein the bis(sulfonyl)diazomethane compound is of the formula (2), and $R^3$ is an unsubstituted $C_5$ or $C_6$ cyclic alkyl group.

8. The radiation sensitive composition according to claim 1, wherein the film-forming resin is an alkali-soluble resin or such a resin wherein at least some of alkali soluble functional groups have acid-labile protective groups.

9. The radiation sensitive composition according to claim 1, wherein the film-forming resin is a resin wherein at least some of hydroxyl groups of polyhydroxystyrenes are protected by groups selected from acid-labile protective groups of the following formulae (3), (4) and (5):

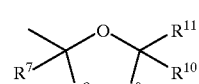
(3)

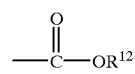
(4)

(5)

wherein each of $R^7$ to $R^{11}$ which are independent of one another, is a hydrogen atom, an alkyl group or an alkoxy group, provided that $R^7$ and $R^9$ may form a ring, and each of $R^{12}$ and $R^{13}$ is an alkyl group.

10. The radiation sensitive composition according to claim 9, wherein the ratio of acid-labile protective groups introduced is from 10 to 60% of hydroxyl groups of the polyhydroxystyrene.

11. The radiation sensitive composition according to claim 9, wherein the film-forming resin is a resin wherein at least some of hydroxyl groups of polyhydroxystyrenes are protected by groups of the formula (3).

12. The radiation sensitive composition according to claim 11, wherein the groups of the formula (3) are ethoxyethyl groups.

13. The radiation sensitive composition according to claim 1, which contains the bis(sulfonyl)diazomethane compound in an amount of from 0.05 to 20 parts by weight per 100 parts by weight of the film-forming resin.

14. The radiation sensitive composition according to claim 1, wherein the bis(sulfonyl)diazomethane compound is of the formula (1).

* * * * *